(12) United States Patent
Mao et al.

(10) Patent No.: US 11,935,753 B2
(45) Date of Patent: Mar. 19, 2024

(54) BACKSIDE AND SIDEWALL METALLIZATION OF SEMICONDUCTOR DEVICES

(71) Applicant: NXP B.V., Eindhoven (NL)

(72) Inventors: Kuan-Hsiang Mao, Kaohsiung (TW); Wen Hung Huang, Kaohsiung (TW); Che Ming Fang, Kaohsiung (TW); Yufu Liu, Kaohsiung (TW)

(73) Assignee: NXP B.V, Eindhoven (NL)

( * ) Notice: Subject to any disclaimer, the term of this patent is extended or adjusted under 35 U.S.C. 154(b) by 204 days.

(21) Appl. No.: 17/546,449

(22) Filed: Dec. 9, 2021

(65) Prior Publication Data
US 2023/0187211 A1 Jun. 15, 2023

(51) Int. Cl.
*H01L 21/283* (2006.01)
*H01L 21/78* (2006.01)
*H01L 23/00* (2006.01)

(52) U.S. Cl.
CPC ............ *H01L 21/283* (2013.01); *H01L 21/78* (2013.01); *H01L 24/03* (2013.01); *H01L 24/05* (2013.01); *H01L 24/11* (2013.01); *H01L 2224/0231* (2013.01); *H01L 2224/02331* (2013.01); *H01L 2224/05558* (2013.01); *H01L 2924/3511* (2013.01)

(58) Field of Classification Search
CPC ....... H01L 21/283; H01L 21/78; H01L 24/03; H01L 24/05; H01L 24/11; H01L 2224/0231; H01L 2224/02331; H01L 2224/05558; H01L 2924/3511; H01L 23/492
See application file for complete search history.

(56) References Cited

U.S. PATENT DOCUMENTS

| | | | |
|---|---|---|---|
| 6,140,703 A | 10/2000 | Cronin et al. | |
| 9,147,624 B2 | 9/2015 | Mackh et al. | |
| 2013/0328203 A1 | 12/2013 | Burgess et al. | |
| 2015/0235969 A1 | 8/2015 | Zhang et al. | |
| 2015/0364376 A1* | 12/2015 | Yu | H01L 24/11 438/460 |
| 2016/0211240 A1* | 7/2016 | Hsieh | H01L 24/97 |
| 2017/0069578 A1* | 3/2017 | Montgomery | H01L 21/78 |
| 2019/0067164 A1* | 2/2019 | Noma | H01L 24/03 |
| 2021/0225708 A1* | 7/2021 | Lee | H01L 25/18 |

OTHER PUBLICATIONS

Moeller et al.; Semiconductor—Wafer Pre Assembly, Robust BSM dicing by rounded backside edges; NXP Semiconductors Germany GmbH; Apr. 16, 2014; (5 pgs).

* cited by examiner

*Primary Examiner* — Thanh T Nguyen

(57) ABSTRACT

A method for forming a packaged integrated circuit device includes providing a semiconductor wafer having a plurality of integrated circuit devices, each integrated circuit device extending into the semiconductor wafer to a first depth, and grinding a backside of the silicon wafer to no more than the first depth. The method further includes forming a backside cut between the integrated circuit devices. The backside cut extends to within the first depth, but the backside cut does not extend completely through the semiconductor wafer. The backside cut exposes a plurality of edges of each of the integrated circuit devices. The method further includes depositing, on the backside of the wafer, a metallization layer on a bottom surface of the integrated circuit devices and on the edges.

11 Claims, 5 Drawing Sheets

US 11,935,753 B2

BACKSIDE AND SIDEWALL METALLIZATION OF SEMICONDUCTOR DEVICES

FIELD OF THE DISCLOSURE

This disclosure generally relates to the fabrication of semiconductor devices, and more particularly relates to providing backside and sidewall metallization of semiconductor devices.

BACKGROUND

Wafer-level packaging (WLP) is an integrated circuit device fabrication technology where the product packaging is performed while the individual integrated circuit devices are still in wafer form. This contrasts with traditional integrated circuit device fabrication where the integrated circuit devices on the wafer are first cut into individual die that are then packaged into the final product. The WLP fabrication process permits the on-site testing of the final integrated circuit devices at the wafer fabrication facility. In contrast, in traditional integrated circuit device fabrication the individual integrated circuit devices are singulated at the wafer fabrication facility, and are sent to one or more different locations for packaging, sorting, and testing. Thus the WLP fabrication process greatly reduces the supply chain dependencies associated with traditional integrated circuit device fabrication.

In a variant of WLP, after the wafer is singulated, the individual integrated circuit devices are treated with a backside metallization process that produces a metal layer on the backside of the integrated circuit devices. Such backside metallization provides a footprint of the conductive metal area that is equal to the footprint of the integrated circuit device. However, such backside metallization may not permit sufficient thermal or electrical contact surface area, and may not adequately protect the backside of the integrated circuit devices.

It would be advantageous to provide a WLP process that provides improved thermal and electrical contact area and protection for the integrated circuit devices fabricated therefrom.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The description will focus on specific implementations and embodiments of the teachings. This focus is provided to assist in describing the teachings, and should not be interpreted as a limitation on the scope or applicability of the teachings. Moreover, other teachings can be used in association with the teachings of this application, as needed or desired, without limiting the scope of the teachings herein.

A method for forming a packaged integrated circuit device may include providing a semiconductor wafer having a plurality of integrated circuit devices, each integrated circuit device extending into the semiconductor wafer to a first depth, and may include grinding a backside of the silicon wafer to no more than the first depth. The method may further include providing a backside cut between the integrated circuit devices. The backside cut may extend to within the first depth, but not completely through the semiconductor wafer. The backside cut may expose a plurality of edges of each of the integrated circuit devices. The method may further includes depositing, on the backside of the wafer, a metallization layer on a bottom surface of the integrated circuit devices and on the edges.

An integrated circuit device may be formed on a semiconductor wafer. The integrated circuit device may have a first depth. Prior to singulation of the integrated circuit device from the semiconductor wafer, the integrated circuit device may include a backside cut between the integrated circuit device and a second integrated circuit device fabricated on the semiconductor wafers. The backside cut may extend to within the first depth, but not extend completely through the semiconductor wafer. The backside cut may expose a plurality of edges of each of the integrated circuit devices. The integrated circuit device may further include a metallization layer deposited on the backside of the wafer such that the integrated circuit device includes the metallization layer on a bottom surface of the integrated circuit device and on the edges of the integrated circuit device.

An integrated circuit device may have a backside metallization layer. The integrated circuit device may include the backside metallization layer on a backside surface of the integrated circuit device, and the backside metallization layer on an edge of the integrated circuit device.

Figure 1:
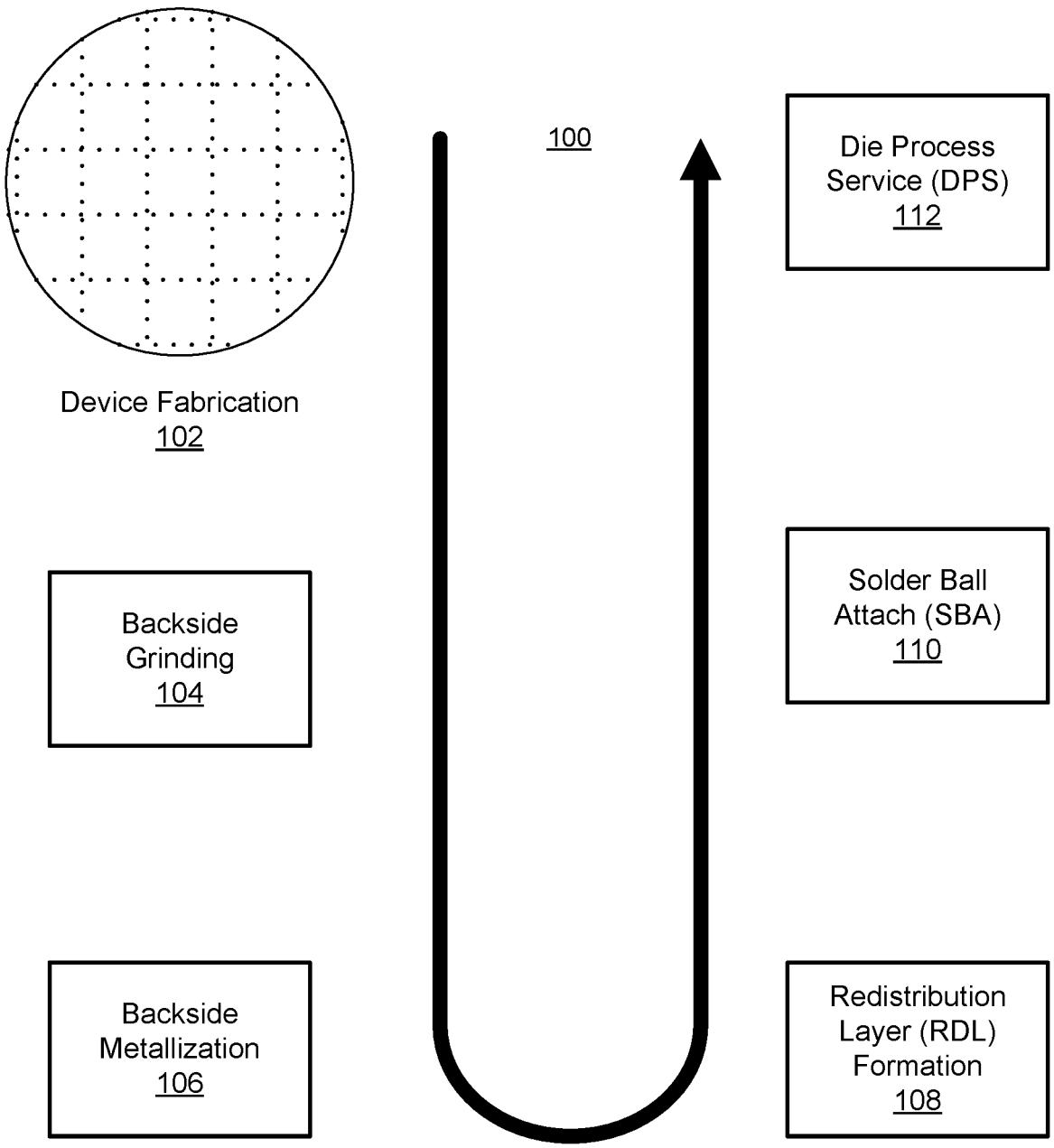
FIG. 1 illustrates a fan-out wafer level packaging (FOWLP) process in accordance with the prior art.

FIG. 1 illustrates a WLP process 100 according to the prior art. Process 100 includes device fabrication 102, backside grinding 104, backside metallization 106, redistribution layer (RDL) formation 108, solder ball attach (SBA) 110, and die process services (DPS) 112. Device fabrication 102 represents the process steps typically associated with the fabrication of integrated circuit devices, such as wafer preparation, photolithographic patterning, material deposition such as chemical deposition, vapor deposition, sputter, or the like, annealing, dopant implantation, passivation growth, and the like. Here, the individual integrated circuit devices are shown with dotted lines on the wafer. The particular details of device fabrication 102 will depend upon the nature of the devices to be fabricated, the design of the devices, the processes implemented by the integrated circuit device manufacturer or fabrication facility, or the like. As such, the teachings of the current disclosure are not limited to a particular device fabrication technology, a particular semiconductor material, or other processes, materials, or features of the device fabrication process utilized to fabricate the integrated circuit devices as described herein. Moreover, the details of device fabrication technologies, semiconductor materials, and processes are known in the art, and will not be further described herein, except as needed to illustrate the current embodiments.

Backside grinding 104 represents a process performed after the completion of device fabrication 102, and that are utilized to reduce the thickness of the integrated circuit devices by removing the bulk silicon from the wafer. Here, semiconductor wafers may be provided that are around 750 µm thick in order to provide mechanical stability and to prevent warping during device fabrication 102. On the other hand, finished integrated circuit devices are typically 50-75 µm thick. Hence backside grinding 104 operates to thin the semiconductor wafer from the 750 µm thickness to the desired end thickness of the integrated circuit devices. Backside grinding 104 may include several process steps, such as a course grinding step to bring the semiconductor wafer to 150 µm or less, a find grinding step to bring the semiconductor wafer to the desired end thickness of the integrated circuit, and a polishing step to remove any scratches or grooves that may have resulted from the fine grinding step, as needed or desired. In other instances, backside grinding 104 may represent other types of processes for thinning the semiconductor wafer, such as chemical or plasma etching, as needed or desired. Further, the process steps utilized in backside grinding may include a combination of grinding steps, etching steps, and polishing steps, as needed or desired.

Backside metallization 106 represents a process performed to apply a metal layer on the backside of the wafer. Backside metallization 106 may include frontside taping to protect the frontside of the integrated circuit devices, wafer pre-treatment including degas and pre-cleaning to remove native oxides and the like, aluminum annealing to form a low resistive contact surface, and metal application. Metals utilized in backside metallization 106 may include titanium alloys including titanium/copper (Ti/Cu), titanium/nickel/aluminum (Ti/Ni/Al), titanium/nickel/silver (Ti/Ni/Ag), titanium/nickel/gold (Ti/Ni/Au), and the like. Processes utilized for the application of the selected metal may include a physical vapor deposition (PVD) process, a sputter process, or the like.

RDL formation 108 represents the process steps to form a first passivation layer on the integrated circuit devices on the carrier, to form the interconnection layers between the integrated circuit device and the outside connection interfaces, to form a second passivation layer on the integrated circuit devices, and to form under-bump metallization (UBM) on the outside connection interfaces in preparation for the attachment of the solder balls. In RDL formation 108, the formation of the first passivation layer includes the deposition of a polymer dielectric layer (the passivation layer) on the surface of the carrier, and the patterned etching of the passivation layer to expose the electrical contacts on the surface of the integrated circuit device such that the subsequently formed interconnect layers are electrically connected to the integrated circuit device. Note here that the first passivation layer is formed only on the surface of the integrated circuit devices, and is prevented from forming on the edges of the integrated circuit devices by the molding compound utilized in forming the carrier. The details of RDL formation are known in the art, and will not be further described herein, except as needed to illustrate the current embodiments.

SBA 110 represents the process steps used to attach solder balls to the UBM regions, thereby forming the integrated circuit device into a package that can be soldered into larger circuits, such as by soldering the integrated circuit device onto a printed circuit board (PCB), or otherwise integrated into a final product, as needed or desired. Finally, DPS 112 represents the process steps used to finalize the integrated circuit device package for shipment to the end user, and may include carrier taping, integrated circuit device re-singulation from the carrier, tape removal, laser marking, and packaging of the packaged integrated circuit devices for shipment to the end users.

Figure 2:
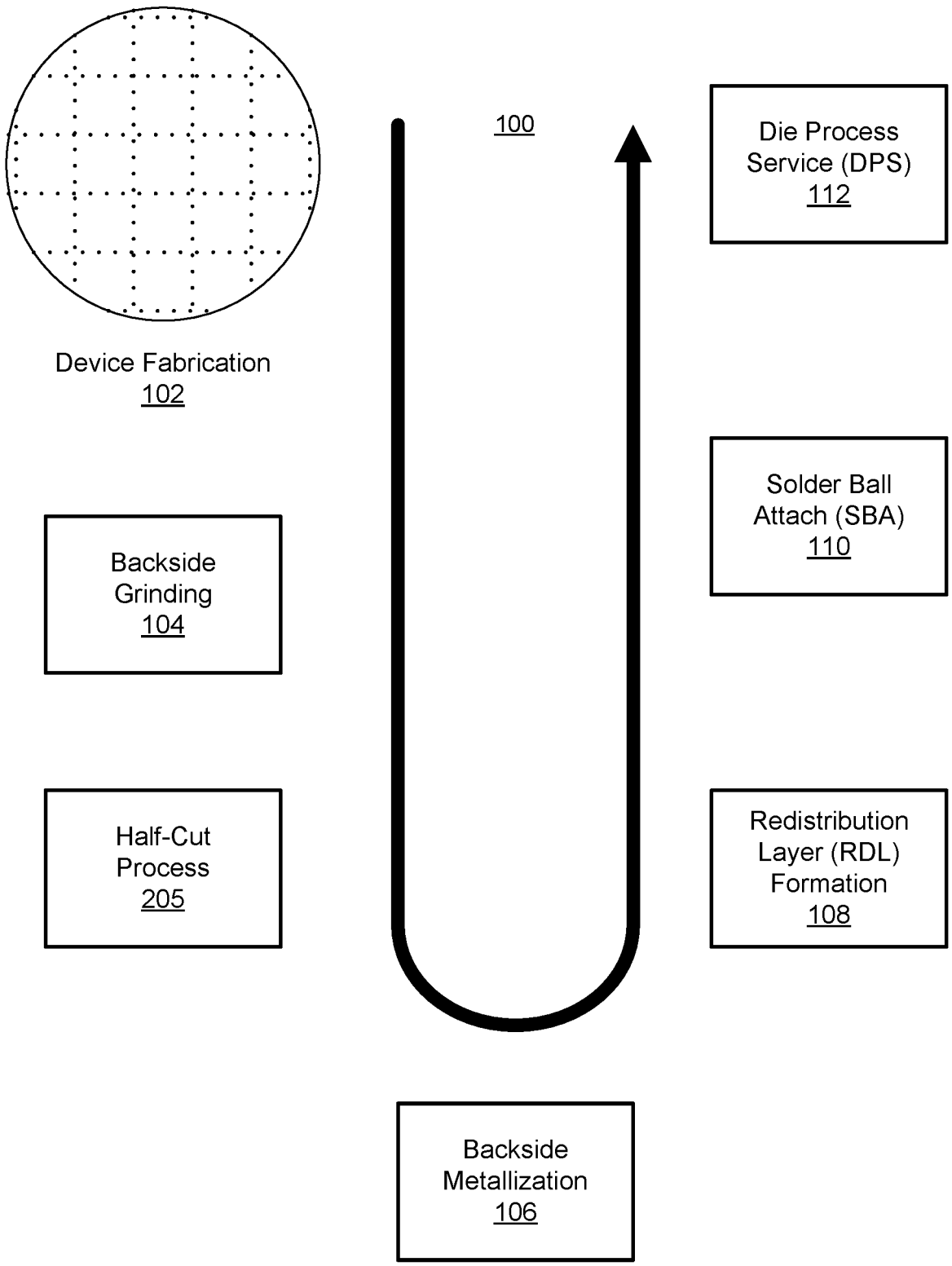
FIG. 2 illustrate a wafer level packaging (WLP) process in accordance with an embodiment of the current disclosure.

FIG. 2 illustrates a WLP process 200 that provides backside and sidewall metallization for the integrated circuit devices that are produced thereby. Process 200 includes device fabrication 102, backside grinding 104, a half-cut process 205, backside metallization 106, RDL formation 108, SBA 110, and DPS 112. Device fabrication 102, may be understood to represent the same process steps in FIG. 1 and in FIG. 2, in that the integrated circuit devices produced by both WLP process 100 and WLP process 200 will each produce functionally similar integrated circuit devices. Further, backside grinding 104, backside metallization 106, RDL formation 108, SBA 110, and DPS 112 may be understood to represent the same process steps in FIG. 1 and in FIG. 2. As such, the description of device fabrication 102, backside grinding 104, backside metallization 106, RDL 108, SBA 110, and DPS 112 will not be redescribed here, but will incorporate the teachings of the prior art WLP process 100, as described above.

Half-cut process 205 represents the process steps related to providing a partial cut on the backside of the wafer between the integrated circuit devices that does not result in the singulation of the integrated circuit devices. In this way, the wafer operates as the carrier for the integrated circuit devices, and no additional process steps for reconstitution are needed. In this way, the wafer retains the structural integrity needed to perform the subsequent process steps. It will be understood that the integrated circuit devices, as formed on the wafer by device fabrication 102 only extend a partial depth into the wafer, and that the remaining depth of the wafer consists of a relatively homogeneous bulk semiconductor material. Here, while half-cut process 205 implies that the cutting process extends halfway through the remaining wafer after wafer grinding 104, the term "half-cut" should not necessarily be construed literally, and the depth of the half-cut process may be understood to extend to the depth associated with the integrated circuit devices, and may be a depth greater than or less than half the wafer thickness, as needed or desired.

Half-cut process 205 may be performed by any suitable singulation process that is amenable to the partial cutting of the wafer. For example, half-cut process 205 may be performed by a saw blade dicing process, a laser dicing process, a plasma dicing process, or the like. It will be understood that, where half-cut process 205 is performed by a saw blade dicing process, the depth of the saw lane may be adjusted on the saw blade dicing equipment as needed or desired. Further, where half-cut process 205 is performed by a laser dicing process, the depth of the laser cut may be adjusted by one or more of the laser power level, the cut speed, or the like, as needed or desired. Finally, where half-cut process 205 is performed by a plasma dicing process, the depth of plasma etching may be adjusted by one or more of the number of plasma etch steps, the duration of the plasma etch steps, or the like. It will be further understood that, where half-cut process 204 is performed by a plasma dicing process, the processing of the integrated circuit devices may be performed within the context of, and as an extension of device fabrication 102, in that the processing equipment utilized in the device fabrication may also be utilized in the half-cut process. As such, the use of plasma dicing processes may result in less handling of the integrated circuit devices and a shrinking of the supply chain processes needed to fabricate the packaged integrated circuit devices. The details of wafer cutting are known in the art, and will not be further described herein except as needed to illustrate the current embodiments. In any case, half-cut process 204 will be understood to expose the edges of the individual integrated circuit devices, while retaining the wafer as the carrier for further WLP processes. Note that, while the process steps of backside metallization 106 may be similar in WLP process 100 and WLP process 200, it will be understood that in WLP process 200, the backside metallization process will result in the metal layer being applied to the sidewall and the bottom of the trench formed by half-cut process 205, and that, as a result, a portion of the sidewalls of the integrated circuit devices, as exposed by the half-cut process are thereby formed with a metal layer. As such, backside metallization 106 may hereinafter be referred to as backside and sidewall metallization 106.

Figure 3:
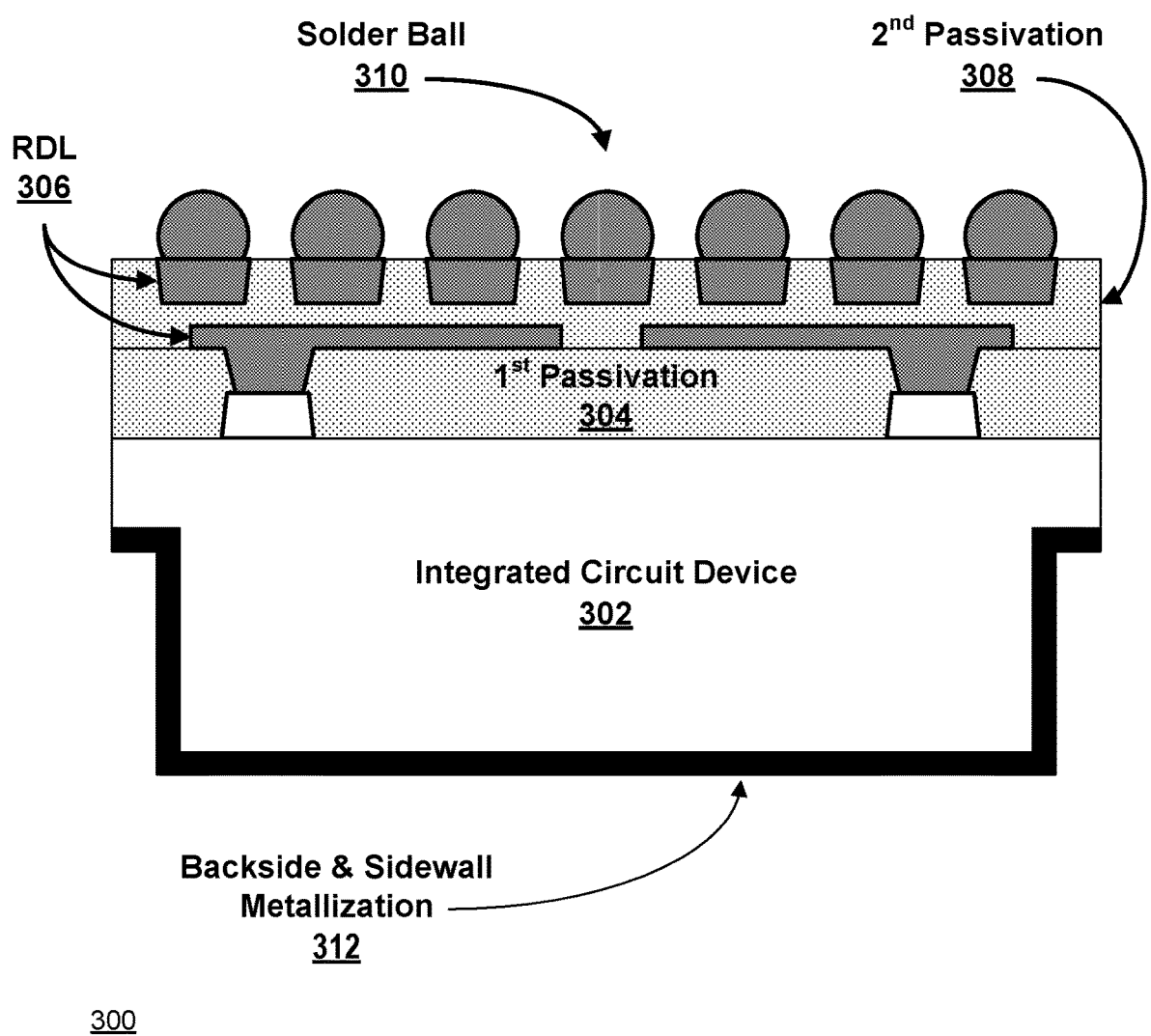
FIG. 3 illustrates a packaged integrated circuit device as may be fabricated utilizing the WLP process of FIG. 2.

FIG. 3 illustrates a packaged device 300 as may be fabricated utilizing process 200. Device 300 includes an integrated circuit device 302, a first passivation layer 304, RDL metallization layers 306, a second passivation layer 308, solder balls 310, and a back-side and sidewall metallization layer 312. Integrated circuit device 302 may be fabricated based upon a device fabrication process similar to device fabrication process 102. A wafer from which integrated circuit device 302 was taken may have been processed by a half-cut process similar to half-cut process 205. Backside and sidewall metallization layer 312 may be applied as a step in a backside metallization process similar to backside and sidewall metallization 106 after the half-cut process. First passivation layer 304, RDL metallization layers 306, and second passivation layer 308 may be formed utilizing a RDL formation process similar to RDL process 208. Solder balls 310 may be applied utilizing a SBA process similar to SBA process 110.

Figure 4:
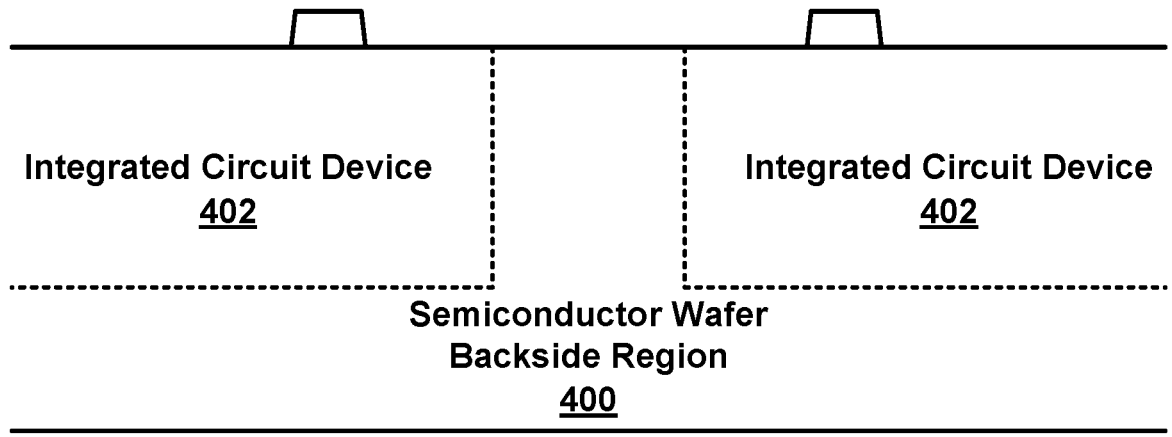
FIGS. 4-8 illustrate select process steps of a WLP process in accordance with an embodiment of the current disclosure.

FIGS. 4-8 illustrate select process steps of a WLP process similar to WLP process 200. FIG. 4 illustrates a semiconductor wafer 400 with integrated circuit devices 402 fabricated into the semiconductor material. Integrated circuit devices 402 may be fabricated based upon a device fabrication process similar to device fabrication process 102. The extend of semiconductor devices 402 is illustrated with dotted lines. Note that integrated circuit devices 402 are separated in semiconductor wafer 400 by a gap of unprocessed semiconductor material of the semiconductor wafer, and that the depth of the integrated circuit devices does not extend to the full depth of the semiconductor wafer.

Figure 5:
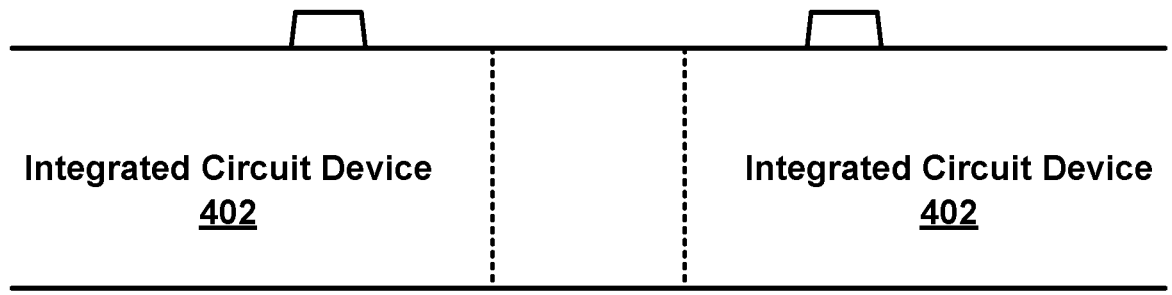

FIG. 5 illustrates semiconductor wafer 400 after having been subjected to process steps similar to backside grinding 104. There, the semiconductor material of semiconductor wafer 400 has been removed by the backside grinding process, leaving the semiconductor wafer substantially equal in depth to the desired end thickness of integrated circuit devices 402.

Figure 6:
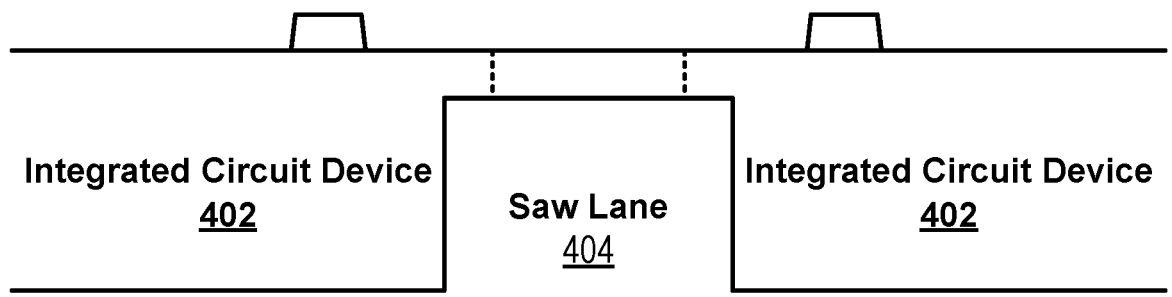

FIG. 6 illustrates semiconductor wafer 400 after having been subjected to process steps similar to backside half-cut process 205. Here, the semiconductor material of semiconductor wafer 400 on the backside of the semiconductor wafer that is between integrated circuit devices 402 has been removed by the half-cut process. The width of the gap between integrated circuit devices 402 is shown as a saw lane width 404. It will be understood that saw lane 404 is broadly representative of the gap formed between integrated circuit devices 402 by whatever cutting process is utilized. Thus, where a laser dicing process is utilized, saw lane 404 may be understood to represent a beam width of the laser utilized in the process, and where a plasma dicing process is utilized, saw lane 404 may be understood to represent a patterned width that is etched into semiconductor wafer 400, as needed or desired. Note that, where a plasma dicing process is utilized, it may be possible to form a narrower gap between integrated circuit devices 402 than may be achievable utilizing either a saw-cut dicing process or a laser dicing process, thereby permitting denser placement of the integrated circuit devices on semiconductor wafer 400. In any case, note that the gap between integrated circuit devices 402 is formed to a depth that is less than the depth of the integrated circuit devices in semiconductor wafer 400. Note further that the width of saw lane 404 is illustrated as being wider than the gap between integrated circuit devices 402, but this is not necessarily so, and a saw lane may be provided that is as wide as the gap between the integrated circuit devices or that is narrower than the gap between the integrated circuit devices, as needed or desired.

Figure 7:
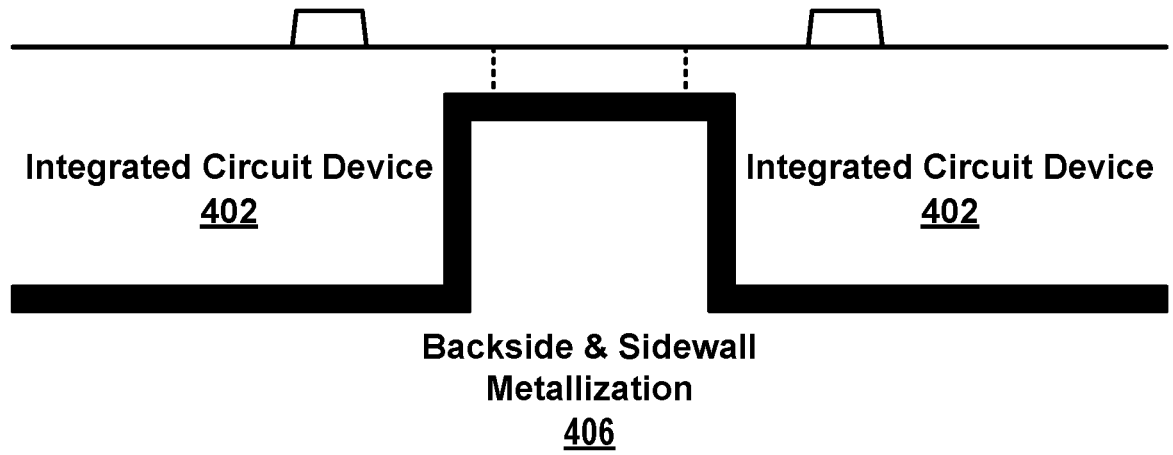

FIG. 7 illustrates semiconductor wafer 400 after having been subjected to process steps similar to backside and sidewall metallization 106. Here, the backside and sidewall metallization process results in the metal layer being applied to the sidewall and the bottom of the trench formed by half-cut process as described in FIG. 6. As noted above, as illustrated in FIGS. 6 and 7, the width of saw lane 404 is wider than the gap between integrated circuit devices 402. As a result, a small horizontal surface on each integrated circuit device 402 is metallized, as well as the exposed sidewall of the integrated circuit devices. However, this is not necessarily ss, and, where saw lane 404 is narrower, other sidewall metallization profiles may be provided as needed or desired. For example, where saw lane 404 is only slightly wider than the gap between integrated circuit devices 402, such as by an amount substantially equal to the width of the metallization layer formed in the trench, then the metallized sidewall may exhibit no horizontal metallization.

Figure 8:
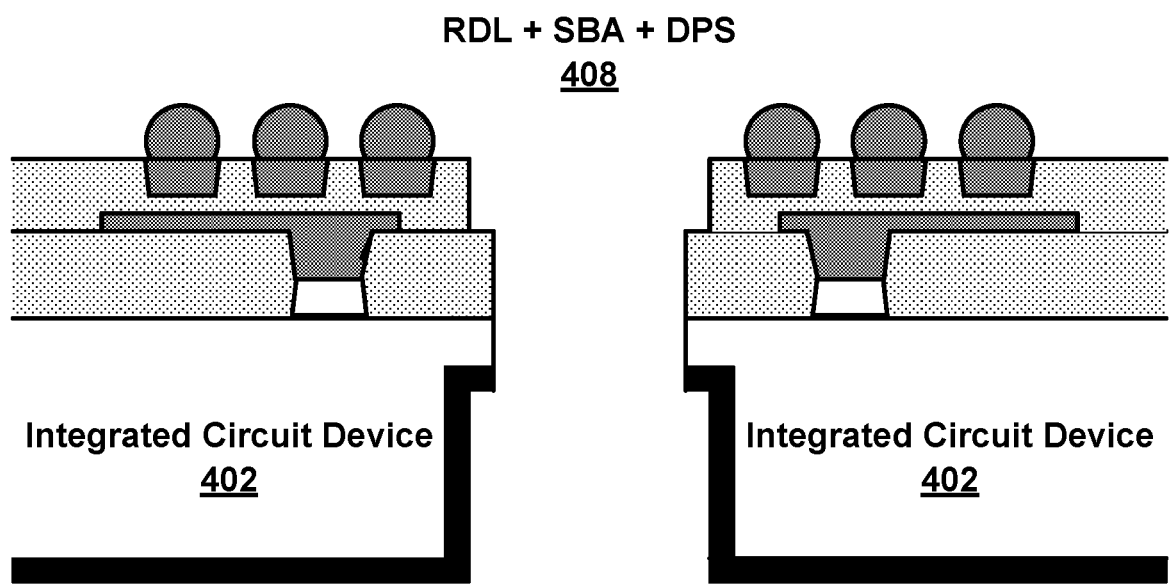

FIG. 8 illustrates finished integrated circuit devices 402 after the completion of RDL formation, SBA processes, and DPS processes. In particular, a frontside cut can be provided to singulate integrated circuit devices 402 from the wafer, and the resulting integrated circuit devices are shown as described in FIG. 3.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for forming a packaged integrated circuit device, the method comprising:

providing a semiconductor wafer having a plurality of integrated circuit devices, each integrated circuit device extending into the semiconductor wafer to a first depth;

grinding a backside of the silicon wafer to no more than the first depth;

forming a backside cut between the integrated circuit devices, the backside cut extending to within the first depth, but the backside cut not extending completely through the semiconductor wafer, wherein the backside cut exposes a plurality of edges of each of the integrated circuit devices; and depositing, on the backside of the wafer, a metallization layer on a bottom surface of the integrated circuit devices and on the edges.

2. The method of claim 1, further comprising:

forming, on a frontside of the integrated circuit devices, a redistribution layer.

3. The method of claim 2, further comprising:

applying, on each integrated circuit device, solder balls on the redistribution layer.

4. The method of claim 1, wherein the backside cut forms a backside trench between the integrated circuit devices, the trench having a first saw lane width.

5. The method of claim 4, wherein in depositing the metallization layer, the metallization layer is deposited to a first thickness on the edges of the integrated circuit devices.

6. The method of claim 5, further comprising:

singulating the integrated circuit devices from the wafer.

7. The method of claim 6, wherein, in singulating the integrated circuit devices from the wafer, the method further comprises:

singulating the integrated circuit devices from the wafer such that a singulation width is equal to the first width less the first thickness.

8. The method of claim 6, wherein, in singulating the integrated circuit devices from the wafer, the method further comprises:

singulating the integrated circuit devices from the wafer such that a singulation width is less than the first width saw lane width less the first thickness.

9. The method of claim 8, wherein after singulating the integrated circuit devices, each integrated circuit device includes a lip of metallized material in a same plane as the backside of the integrated circuit devices.

10. The method of claim 1, wherein, in providing the backside cut between the integrated circuit devices, the cutting comprises:

providing a laser dicing process.

11. The method of claim 1, wherein, in providing the backside cut between the integrated circuit devices, the cutting comprises:

providing a plasma dicing process.

* * * * *